(12) United States Patent
Alvarez Serrano et al.

(10) Patent No.: US 7,913,894 B2
(45) Date of Patent: *Mar. 29, 2011

(54) SELECTIVE SOLDERING SYSTEM

(75) Inventors: Esteban Arturo Alvarez Serrano, Delegación Playas de Tijuana (MX); Julián Martinez Fonseca, Delegación el Florido (MX); Horman Armando Millán Sánchez, Tijuana (MX)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/556,955

(22) Filed: Sep. 10, 2009

(65) Prior Publication Data

US 2010/0001039 A1 Jan. 7, 2010

Related U.S. Application Data

(63) Continuation of application No. 11/949,959, filed on Dec. 4, 2007, now Pat. No. 7,631,796.

(51) Int. Cl.
*B23K 1/08* (2006.01)
(52) U.S. Cl. ............ 228/36; 228/33; 228/40; 228/43; 228/47.1; 228/56.1; 228/180.1

(58) Field of Classification Search .......... 228/33, 228/36, 37, 39, 40, 43, 47.1, 49.1, 49.2, 49.5, 228/56.1, 180.1, 259, 260
See application file for complete search history.

(56) References Cited

U.S. PATENT DOCUMENTS

| | | | | |
|---|---|---|---|---|
| 4,512,510 A | * | 4/1985 | Kondo | 228/40 |
| 7,631,796 B2 | * | 12/2009 | Serrano et al. | 228/36 |
| 7,648,056 B1 | * | 1/2010 | Serrano et al. | 228/56.1 |

FOREIGN PATENT DOCUMENTS

DE 19953316 A1 * 5/2001
JP 2007109959 A * 4/2007

OTHER PUBLICATIONS

JPO machine translation of JP 2007109959 A, Apr. 26, 2007.*

* cited by examiner

*Primary Examiner* — Jessica L Ward
*Assistant Examiner* — Kevin E Yoon
(74) *Attorney, Agent, or Firm* — John L. Rogitz

(57) ABSTRACT

A solder machine includes a top flat carrier that holds PWBs just above a solder bath. Opposed edges of the carrier are coupled to a frame and each edge can be independently raised or lowered by a respective piston. Also, the base of the frame can pivot along one of its edges to provide a second degree of freedom of motion to the top flat carrier in dipping the PWBs relative to the solder bath, thereby providing a solder machine with a relatively small footprint that nonetheless can achieve precise soldering of PWBs.

2 Claims, 4 Drawing Sheets

SELECTIVE SOLDERING SYSTEM

This is a continuation of U.S. patent application Ser. No. 11/949,959, filed Dec. 4, 2007 now U.S. Pat. No. 7,631,796, from which priority is claimed.

FIELD OF THE INVENTION

The present invention relates generally to printed wiring board (PWB) soldering machines that dip, in two degrees of freedom, PWBs into a solder bath to effect soldering.

BACKGROUND OF THE INVENTION

Solder machines are used to dip components such as printed wiring boards into solder baths to effect mechanical-electrical connections. To undertake this dipping automatically, previous wave soldering systems have been used that have been relatively bulky to accommodate necessary conveyance of the PWBs into the solder bath at the desired locations of the PWBs. Furthermore, the bulkiness of the prior wave soldering machines has been necessitated to accommodate required soldering precision. Such prior machines have typically consumed around three square meters of valuable factory floor space.

SUMMARY OF THE INVENTION

A selective soldering machine provides greater soldering precision with a smaller footprint (around a single square meter) by means of using two degrees of freedom of the component that dips the PWB into the solder bath.

Accordingly, a selective soldering machine has a solder bath, preferably coated with ceramic, and a frame juxtaposed with the solder bath and including a carrier configured for holding a component such as a PWB to be soldered. The frame moves the carrier in first and second degrees of freedom relative in order to the solder bath to solder the component only on needed areas by, e.g., using nozzles for applying melted solder to the areas.

The first degree of freedom can be provided by tilting a first edge of the carrier using a linear actuator, e.g., a first piston, coupled to the first edge. A second linear actuator such as a second piston may be coupled to a second edge of the carrier and operable independently of the first piston. The first and second edges are opposed to each other. The frame can also include a base below the carrier and coupled thereto, with the frame being pivotable by, e.g., a base piston to provide the second degree of motion.

In another aspect, a method of soldering a printed wiring board (PWB) includes pivoting, relative to a solder bath, a top flat carrier holding the PWB, and pivoting, relative to the solder bath, a base of a frame connected to the top flat carrier. Pivoting of the top flat carrier is coordinated with pivoting of the base to effect soldering of at least one preselected part of the PWB using solder in the solder bath.

In still another aspect, a solder machine includes a top flat carrier configured to hold at least one and preferably plural printed wiring boards (PWB) and a solder bath disposed beneath the flat carrier. First and second pistons are coupled to a frame and to respective opposed first and second edges of the carrier and are independently operable to raise or lower the respective edges. A base of the frame is disposed below the top flat carrier. The base is pivotable along an edge thereof to provide a degree of freedom of motion to the top flat carrier in dipping the PWB relative to the solder bath.

The details of the present invention, both as to its structure and operation, can best be understood in reference to the accompanying drawings, in which like reference numerals refer to like parts, and in which:

DETAILED DESCRIPTION OF THE PREFERRED EMBODIMENT

Terms of height such as "top", "bottom", "above", "below", "upper", "lower", "higher", "lower", etc. as used herein are relative to the soldering machine when it is positioned on the floor of an assembly plant as intended.

Figure 1:
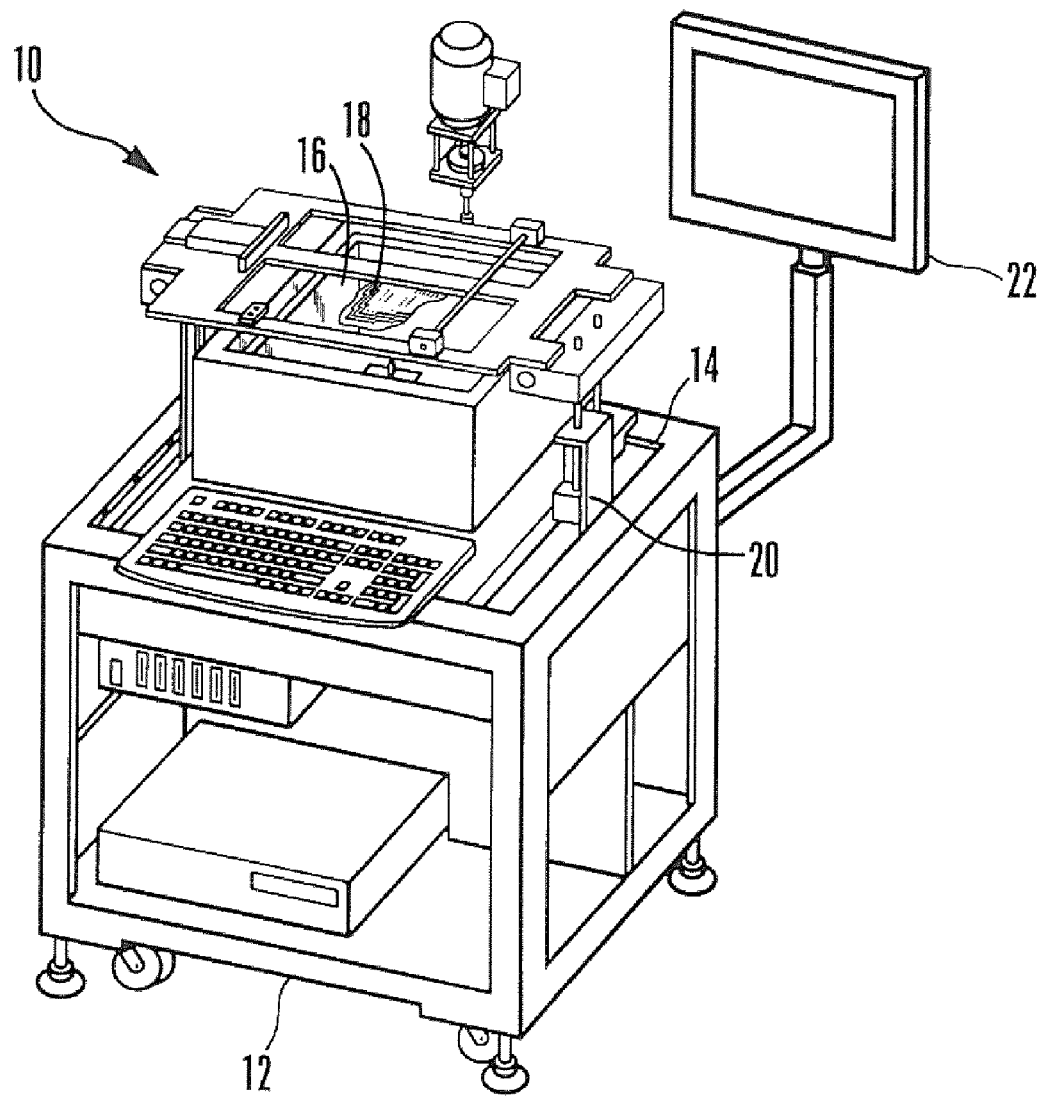
FIG. 1 is a perspective view of the present solder machine, showing PWBs on the top carrier.
Figure 2:
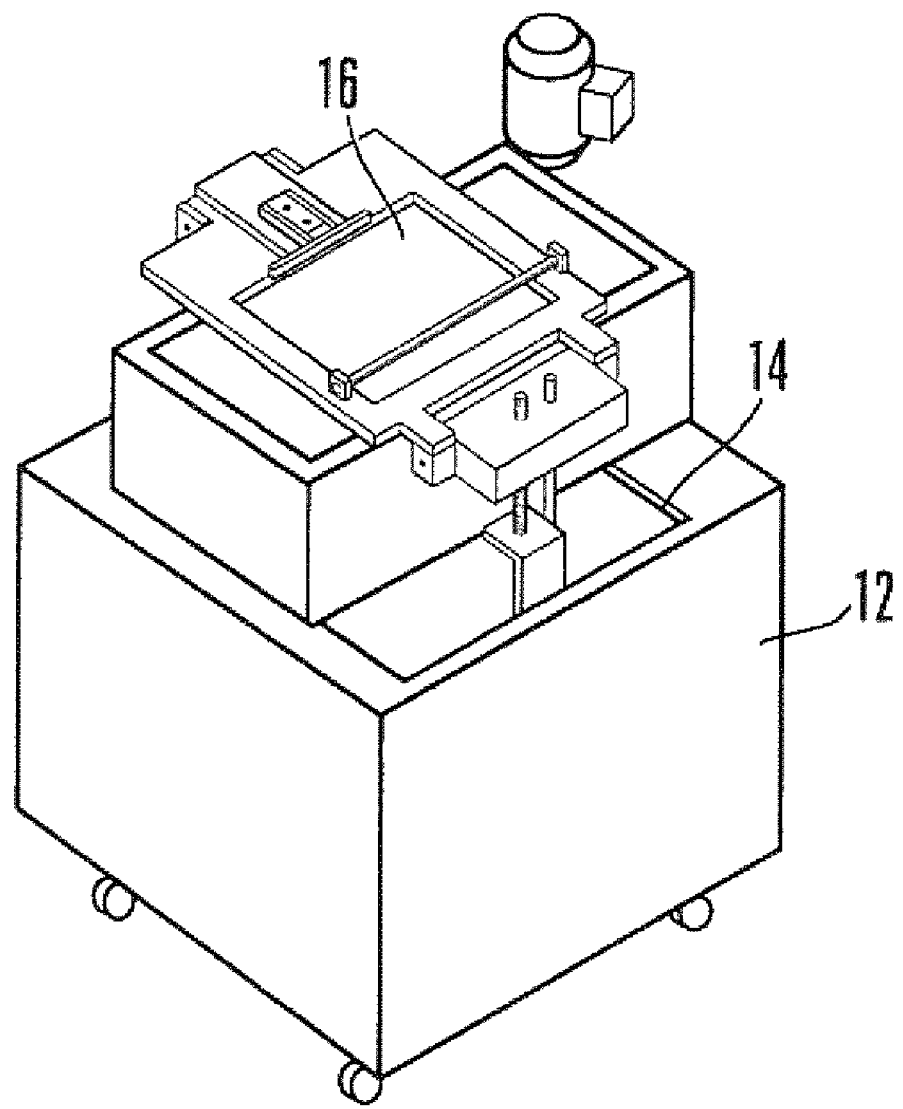
FIG. 2 is a perspective view of the present solder machine with the PWBs and operator display removed for clarity.

Referring initially to FIGS. 1 and 2, a solder machine is shown, generally designated 10, which includes a shroud or housing 12 enclosing a frame 14 that is coupled to a solder bath 16 holding solder for dip-soldering components such as printed wiring boards (PWB) 18. The solder machine 10 may support a processor 20 (shown schematically in FIG. 1) that controls motion of the frame in accordance with disclosure below. The processor 20 may output information on a computer monitor 22 if desired.

Figure 3:
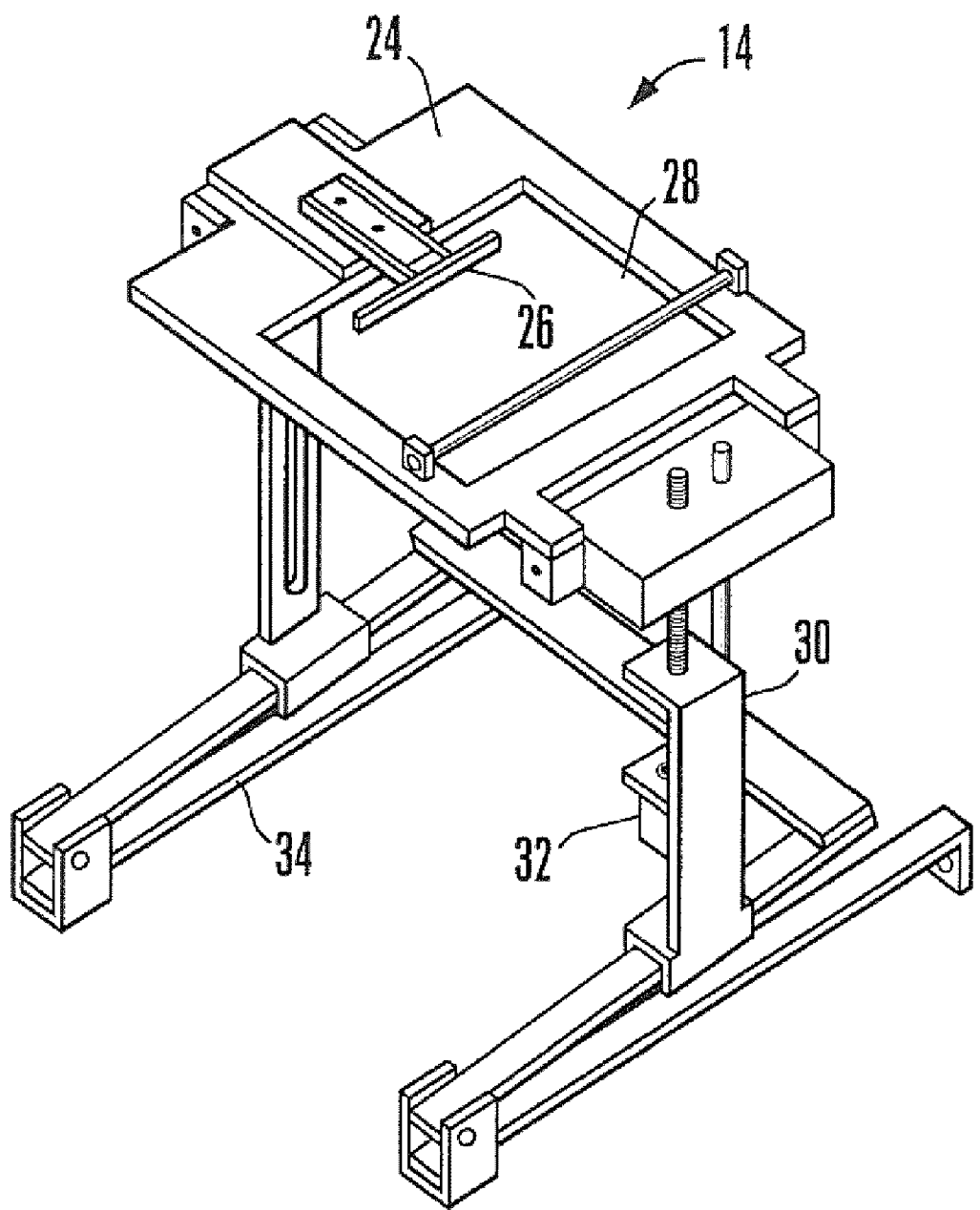
FIG. 3 is a perspective view of the frame and top carrier with the housing of the machine removed.
Figure 4:
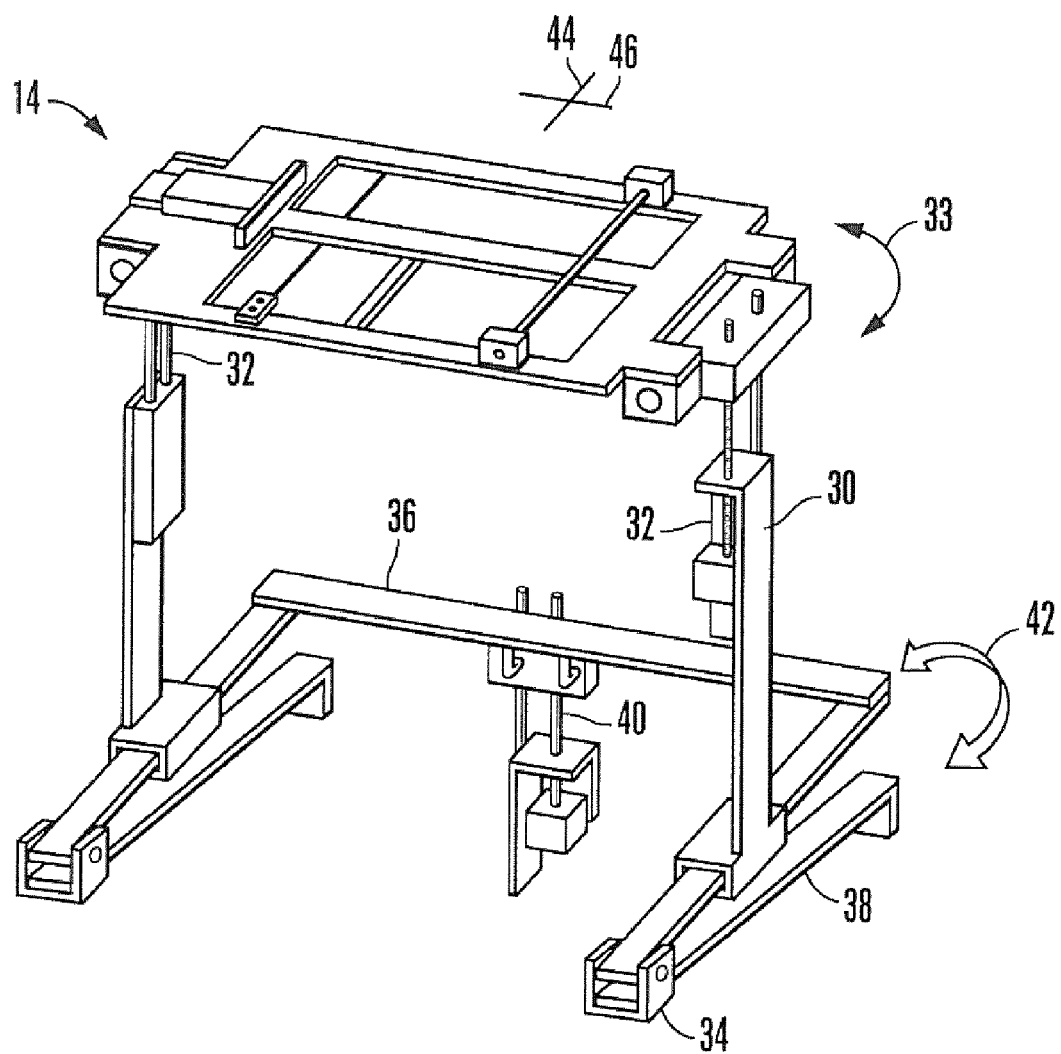
FIG. 4 is a perspective view of the frame and top carrier illustrating the two degrees of freedom of motion of the top carrier.

Details of the frame 14 and how it moves with two degrees of freedom relative to the (non-moving) solder bath 16 can be seen in cross-reference to FIGS. 3 and 4. The frame 14 includes a top flat generally rectilinear PWB carrier 24 which includes support structure 26 for supporting one or more PWBs. The PWBs may plug into the support structure 26 or may rest on it or be clamped or otherwise held by the support structure 26. It is to be appreciated that parts of the PWBs to be soldered extend below a central cavity 28 defined by the carrier 24 and toward the solder bath below, so that as the carrier 24 is moved in accordance with disclosure below the portions of the PWBs are dipped into molten solder.

As shown, the frame 14 includes two vertical legs 30 that support the carrier 24 in the generally horizontal orientation shown. Specifically, each leg 30 includes a respective vertically-oriented edge piston 32 that is coupled to a respective edge of the carrier 24, with opposed edges of the carrier 24 thus being coupled to respective edge pistons 32 as best shown in FIG. 4. The edge pistons 32 are independently operable to raise and lower their respective edges of the carrier 24 to thereby tilt the carrier 24 in what can be regarded as a Cartesian x-dimension as shown by the arrow 33.

In turn, the legs 30 are supported on a base 34 of the frame 14. As best shown in FIG. 4, the base 34 includes a U-shaped pivot bar 36 the opposed arms of which are hingedly coupled at their free ends to stationary horizontal base supports 38. A base piston 40 is coupled to the pivot bar 36 to pivot it up and down relative to the base supports 38 as shown by the arrow 42. This motion, since the pivot axis is at the ends of the U-shaped pivot bar 36 and, hence, is off-center relative to the carrier 24, tilts the carrier 24 in a dimension that is orthogonal to the x-dimension, and that consequently may be thought of as the Cartesian y-dimension.

Put another way, the edge pistons 32 tilt the carrier 24 about a line 44 (FIG. 4) that is parallel to the edges to which the edge pistons 32 are coupled, whereas the base piston 40 tilts the carrier 24 about a line 46 that is perpendicular to the edges of the carrier 24 to which the edge pistons are coupled.

Accordingly, one degree of freedom is provided by the pivoting of the top carrier 24 by the two edge pistons 32 coupled to opposed edges of the carrier 24 that can independently move their respective edge up and down. The bottom of the frame 14, and more specifically the pivot bar 36, which is distanced from the top carrier 24, pivots along one of its edges (i.e., the free ends of the arms of the U-shaped pivot bar 36) owing to the base piston 40, to provide the other degree of freedom.

Each piston 32, 40 is electrically actuated by a respective electrically-controlled actuator such as a servo that is controlled by the processor 20 as desired to tilt the carrier 24 to solder predetermined parts of the PWBs 18. Thus, pivoting motion of the carrier 24 is coordinated with pivoting motion of the pivot bar 36 to dip selected parts of the PWBs relative to the solder bath 16, which is enclosed by the frame 14 just beneath the carrier 24, with the solder bath remaining stationary as the carrier 24 moves. In this way, only needed areas of the PWB are soldered by, e.g., using nozzles for applying melted solder from the bath to the areas.

While the particular SELECTIVE SOLDERING SYSTEM is herein shown and described in detail, it is to be understood that the subject matter which is encompassed by the present invention is limited only by the claims. For example, pistons may be used but other linear actuators such as rack-and-pinion style actuators driven by, e.g., stepper motors may be used.

What is claimed is:

1. A solder machine, comprising:
   a top flat carrier configured to hold at least one printed wiring board (PWB);
   at least one solder bath disposed beneath the flat carrier;
   first and second linear actuators coupled to a frame and to respective opposed first and second edges of the carrier, the linear actuators being independently operable to raise or lower the respective edges; and
   a base of the frame coupled to the top flat carrier and disposed below the top flat carrier, the base being pivotable along an edge thereof to tilt and thereby provide a degree of freedom of motion to the top flat carrier in dipping the PWB relative to the solder bath, the base including a pivot element, a base actuator being coupled to the pivot element to pivot the pivot element up and down, a base pivot axis being defined at ends of the pivot element and hence being off-center relative to the carrier such that moving the base actuator tilts the carrier.

2. The solder machine of claim 1, wherein the first and second edges are opposed to each other.

* * * * *